(12) United States Patent
Purkl et al.

(10) Patent No.: US 10,035,696 B2
(45) Date of Patent: Jul. 31, 2018

(54) MEMS COMPONENT INCLUDING A DIAPHRAGM ELEMENT WHICH IS ATTACHED VIA A SPRING STRUCTURE TO THE COMPONENT LAYER STRUCTURE

(71) Applicant: Robert Bosch GmbH, Suttgart (DE)

(72) Inventors: Fabian Purkl, Gerlingen (DE); Michael Stumber, Korntal-Muenchingen (DE); Ricardo Ehrenpfordt, Korntal-Muenchingen (DE); Rolf Scheben, Reutlingen (DE); Benedikt Stein, Stuttgart (DE); Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 36 days.

(21) Appl. No.: 15/214,193

(22) Filed: Jul. 19, 2016

(65) Prior Publication Data
US 2017/0022047 A1 Jan. 26, 2017

(30) Foreign Application Priority Data
Jul. 22, 2015 (DE) .................. 10 2015 213 772

(51) Int. Cl.
*B81B 3/00* (2006.01)
*H04R 17/02* (2006.01)

(52) U.S. Cl.
CPC ........... *B81B 3/0072* (2013.01); *H04R 17/02* (2013.01); *B81B 2201/0257* (2013.01); *B81B 2203/0127* (2013.01); *B81B 2203/0163* (2013.01); *H04R 2201/003* (2013.01)

(58) Field of Classification Search
CPC .................................................... B81B 3/0072
See application file for complete search history.

(56) References Cited

U.S. PATENT DOCUMENTS

2007/0277616 A1* 12/2007 Nikkel .................. G01L 9/0052
73/715

* cited by examiner

*Primary Examiner* — Matthew Reames
*Assistant Examiner* — Christopher Culbert
(74) *Attorney, Agent, or Firm* — Norton Rose Fulbright US LLP; Gerard Messina

(57) ABSTRACT

Measures are provided, by which mechanical stresses within the diaphragm structure of a MEMS component may be intentionally dissipated, and which additionally enable the implementation of diaphragm elements having a large diaphragm area in comparison to the chip area. The diaphragm element is formed in the layer structure of the MEMS component. It spans an opening in the layer structure and is attached via a spring structure to the layer structure. The spring structure includes at least one first spring component, which is oriented essentially in parallel to the diaphragm element and is formed in a layer plane below the diaphragm element. Furthermore, the spring structure includes at least one second spring component, which is oriented essentially perpendicularly to the diaphragm element. The spring structure is designed in such a way that the area of the diaphragm element is greater than the area of the opening which it spans.

15 Claims, 4 Drawing Sheets

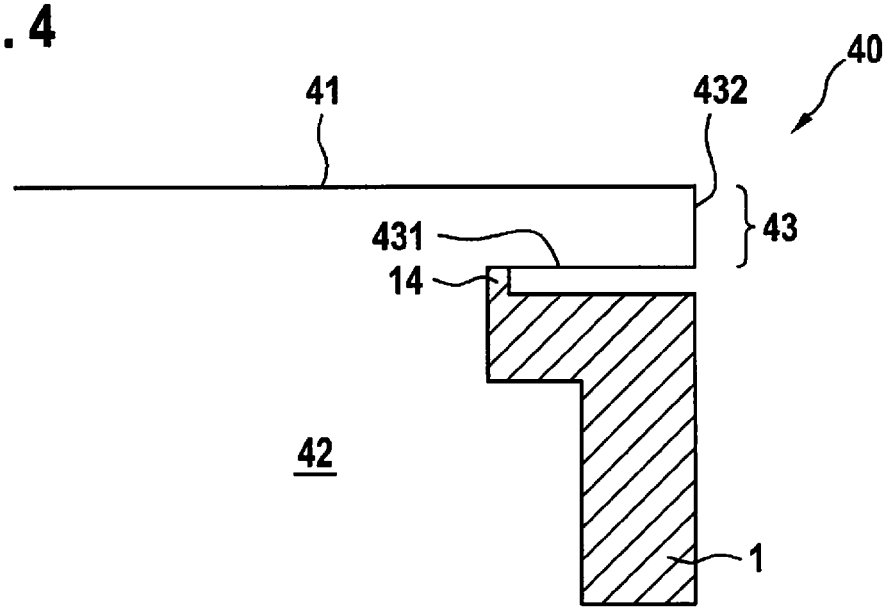
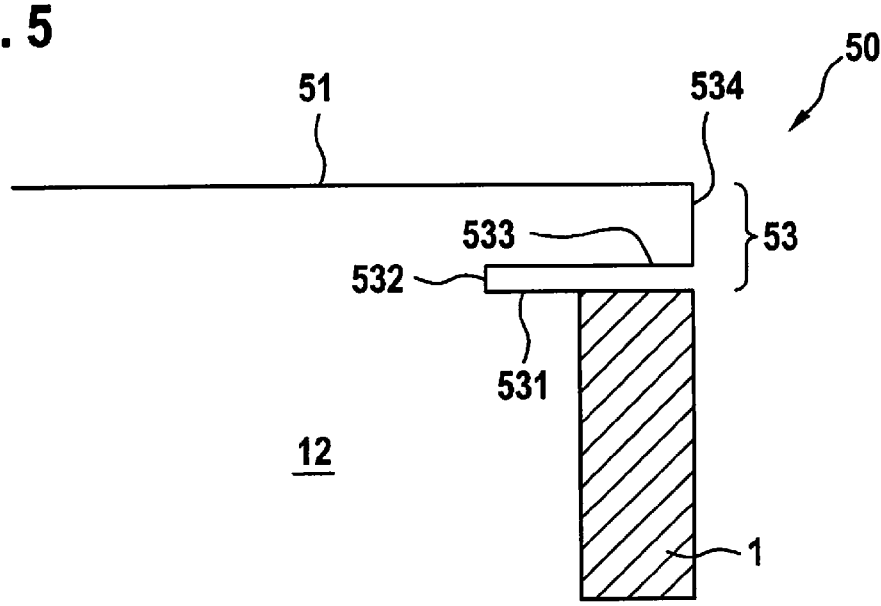

MEMS COMPONENT INCLUDING A DIAPHRAGM ELEMENT WHICH IS ATTACHED VIA A SPRING STRUCTURE TO THE COMPONENT LAYER STRUCTURE

CROSS REFERENCE

The present application claims the benefit under 35 U.S.C. § 119 of German Patent Application No. DE 102015213772.4 filed on Jul. 22, 2015, which is expressly incorporated herein by reference in its entirety.

BACKGROUND INFORMATION

The present invention relates very generally to MEMS components, in the layer structure of which at least one diaphragm element is formed, which spans an opening in the layer structure and is attached via a spring structure to the layer structure.

With corresponding design of the diaphragm element and equipment with piezosensitive circuit elements for signal detection, such components may be used, for example, as pressure sensors or also as a microphone.

One particular advantage of piezosensitive MEMS microphone components is that—in contrast to capacitive MEMS microphone components—they may be equipped very easily with a "wake-up" functionality. They may thus be conceived very easily so that they only consume power if needed, i.e., for example, only if a specific sound level is exceeded. The power consumption of piezosensitive MEMS microphone components in the "always-on" operating mode is thus significantly less than that of capacitive MEMS microphone components.

The microphone sensitivity is generally dependent on the size of the microphone diaphragm, i.e., the larger the diaphragm area, the higher the sensitivity as well. However, with increasing diaphragm area, mechanical stresses also occur more strongly within the diaphragm, which corrupt the measuring signal. Such intrinsic mechanical stresses may be due to manufacturing or may also be attributed to temperature variations at the site of operation.

SUMMARY

Measures are provided by the present invention, by which mechanical stresses inside the diaphragm structure may be intentionally dissipated, and which additionally enable the implementation of diaphragm elements having a large diaphragm area in comparison to the chip area.

This is achieved according to the present invention in that the spring structure includes at least one first spring component, which is oriented essentially in parallel to the diaphragm element and is formed in a layer plane below the diaphragm element, the spring structure includes at least one second spring component, which is oriented essentially perpendicularly to the diaphragm element, and the spring structure is designed in such a way that the area of the diaphragm element is greater than the area of the opening which the diaphragm element spans.

The spring structure is accordingly not formed two-dimensionally in the diaphragm plane, but rather three-dimensionally, so that the intrinsic mechanical stresses of the diaphragm element are introduced via the second spring component, which is oriented perpendicularly to the diaphragm plane, into the first spring component aligned in parallel to the diaphragm plane. The relaxation of the diaphragm element thus takes place here in all three spatial directions. In addition, the three-dimensional spring structure according to the present invention—in contrast to a two-dimensional spring structure in the diaphragm plane—does not require any additional chip area. The three-dimensional spring structure is a requirement for the claimed implementation of diaphragm elements which are larger than the opening which they span.

Fundamentally, there are various possibilities for the implementation of a MEMS component according to the present invention, with regard to the design of the diaphragm element, but also of the spring structure. The function of the MEMS component will always play an important role.

In the case of a sensor application for absolute pressure or relative pressure detection, the diaphragm element and the spring structure are advantageously designed as essentially closed.

In contrast thereto, it has proven to be advantageous in the case of use as a microphone component, for example, if openings are formed in the spring structure and/or in the adjoining edge area of the diaphragm element, which enable a slow pressure equalization between the two sides of the diaphragm element. The pressure equalization via these openings is also not impaired by mechanical stresses in the component structure.

The implementation of the diaphragm element and the spring structure in the layer structure of the MEMS component offers many freedoms not only with respect to the shape of the individual structure elements but rather also with respect to the structure thickness. The diaphragm element and the first spring component, which is structured out of the layer lying underneath may thus be designed having different thicknesses very easily, for example, to promote targeted stress introduction into the spring structure. The structure thickness of each individual structure element may also be varied. Thus, for example, the middle area of the diaphragm element may be made thicker than its edge area.

It often proves to be advantageous to stiffen the second spring component, which is oriented perpendicularly to the diaphragm plane, in relation to the first spring component of the spring structure. For this purpose, this second spring component may simply be made thicker than the first spring component. However, an additional web-like stiffening element may also be provided in the spring structure, which is formed in parallel to the second spring component.

In one advantageous embodiment of the present invention, a stop for the diaphragm element is formed in the area of the spring structure. This proves to be advantageous in particular if the diaphragm edge and/or the spring structure are formed as sufficiently thin, to increase the sensitivity, that they cannot withstand the expected pressure load.

The connection areas between the diaphragm element and the spring structure, between the individual components of the spring structure, and between the spring structure and the layer structure are advantageously rounded, to avoid the occurrence of intrinsic mechanical stress in an angled three-dimensional component structure.

As already mentioned, an embodiment of the present invention is also suitable in particular for the implementation of piezosensitive MEMS microphone components having at least one sound-pressure-sensitive diaphragm element. The piezosensitive circuit elements for detecting the diaphragm deflections are advantageously situated here in the area of the spring structure and/or in the adjoining edge area of the diaphragm element, where the greatest mechanical stresses are to be expected. The comparatively large microphone diaphragm and the three-dimensional spring structure, via which the microphone diaphragm is attached to the layer structure, result in an improvement of the microphone performance, in that the microphone sensitivity is increased and the signal-to-noise ratio is improved. At the same time, such a MEMS microphone component is insensitive to intrinsic stress and variations of the ambient temperature.

BRIEF DESCRIPTION OF THE DRAWINGS

As explained above, there are various possibilities for advantageously developing and refining the teaching of the present invention. For this purpose, reference is made to the description below of multiple exemplary embodiments of the present invention.

FIGS. 2 through 6 each show a sectional view of a further MEMS component 20, 30, 40, 50, 60 according to the present invention in the area of the spring structure between diaphragm element and layer structure.

DETAILED DESCRIPTION OF EXAMPLE EMBODIMENTS

Figure 1A:
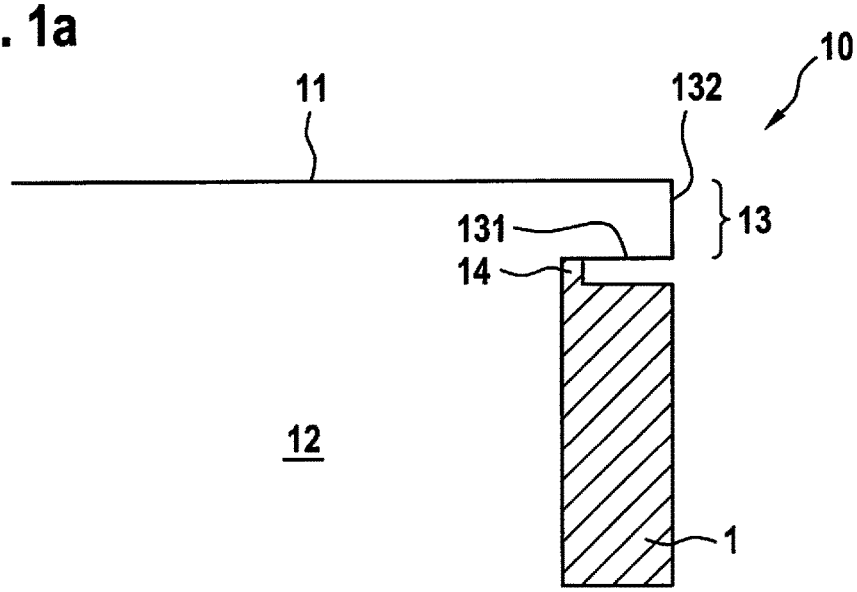
FIG. 1a shows a sectional view of a first MEMS component 10 according to the present invention in the area of the spring structure between diaphragm element and layer structure.
Figure 1B:
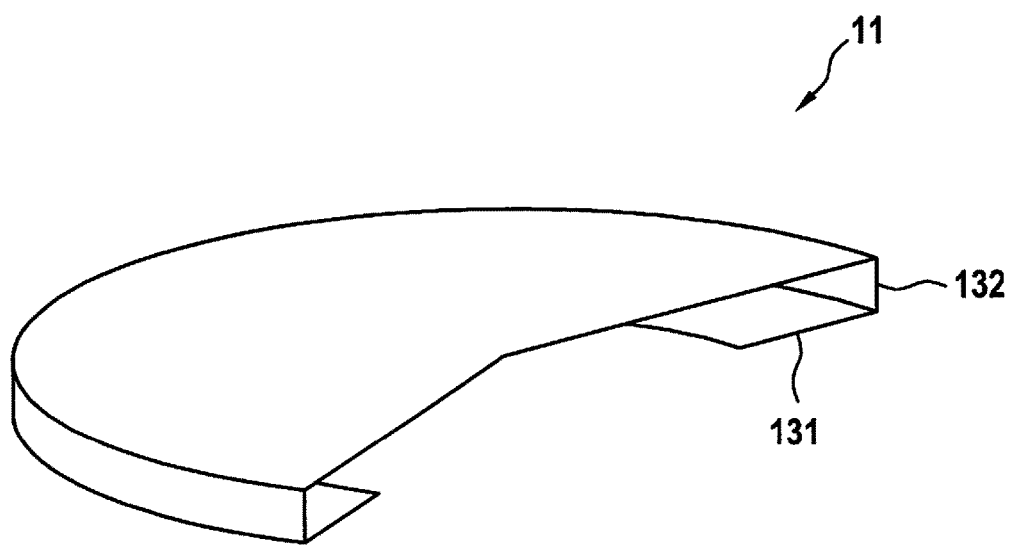
FIG. 1b shows a perspective partial view of the diaphragm element of this MEMS component 10.

FIGS. 1 and 1b illustrate an example component according to the present invention, according to which MEMS component 10 includes a diaphragm element 11, which spans an opening 12 in the rear side of component substrate 1. In the exemplary embodiment shown here, diaphragm element 11 is circular—see FIG. 1b—and the rear opening is cylindrical—see FIG. 1a. Diaphragm element 11 is implemented in a layer structure on component substrate 1 and is attached via a spring structure 13 to the layer structure or component substrate 1. Spring structure 13 is also structured out of the layer structure.

According to the present invention, spring structure 13 includes a first spring component 131, which is oriented essentially in parallel to diaphragm element 11 and is formed in a layer plane below diaphragm element 11. Essentially in parallel means that first spring component 131 is oriented in parallel or in parallel except for minor deviations in relation to diaphragm element 11. This first spring component 131 is in the form of a circular ring in the exemplary embodiment shown here and is connected via a circumferential rigid base 14 to the upper edge of rear opening 12. It extends from base 14 up to the outer edge of MEMS chip 10.

Furthermore, spring structure 13 according to the present invention includes a second spring component 132, which is oriented essentially perpendicularly to diaphragm element 11. Essentially means that minor deviations from the perpendicular, which are caused by manufacturing, for example, are unremarkable. In the exemplary embodiment shown here, this second spring component 132 establishes a connection between the outer edge of first spring component 131 and the outer edge of diaphragm element 11, which also extends up to the outer edge of MEMS chip 10 here. The area of diaphragm element 11 is accordingly greater than the cross-sectional area of rear opening 12, which is enabled by the design according to the present invention of spring structure 13. In addition, intrinsic stress in diaphragm element 11 may be dissipated very well via such a three-dimensional spring structure 13.

Since both diaphragm element 11 and spring structure 13 of MEMS component 10 shown in FIGS. 1a and 1b are completely closed, this specific embodiment of the present invention is particularly suitable for pressure detection. Depending on the installation of MEMS component 10, two different measured pressures may be applied to both sides of diaphragm element 11, to ascertain the relative pressure, or one measured pressure may be applied on only one side for absolute pressure measurement. In the case of absolute pressure measurement, the measured pressure acts against a defined reference pressure prevailing on the other side of diaphragm element 11. In both cases, the deflection of diaphragm element 11 is detected, preferably with the aid of piezosensitive circuit elements, which are situated in the area of spring structure 13 and/or in the adjoining edge area of diaphragm element 11, where the greatest mechanical stresses occur in the event of pressure action.

Figure 2:
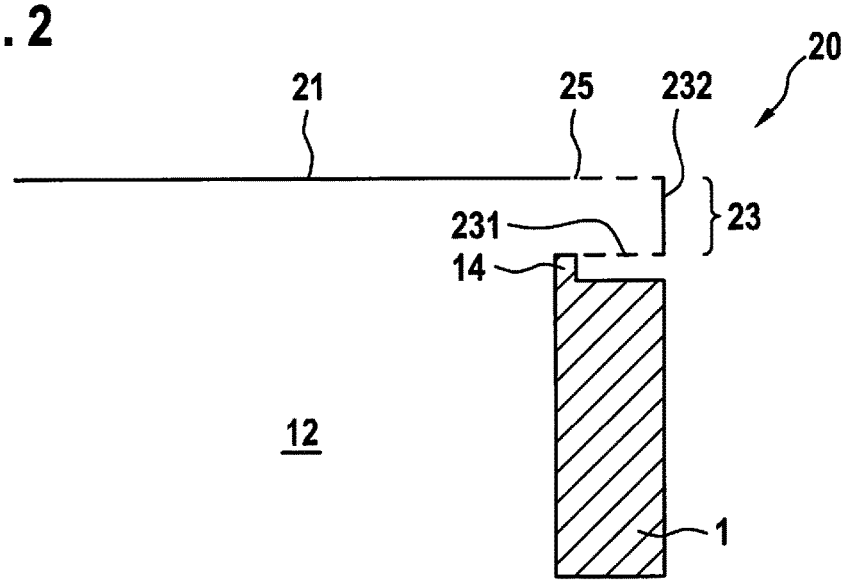

In contrast to MEMS component 10, in MEMS component 20 shown in FIG. 2, ventilation openings 25 are formed both in spring structure 23, more precisely in first spring component 231 and in the edge area of diaphragm element 21 adjoining spring structure 23, these openings enabling a slow pressure equalization between the two sides of diaphragm element 21 as is required for microphone applications. How rapidly this pressure equalization takes place is essentially dependent on the number, size, and arrangement of ventilation openings 25 and may be intentionally influenced via these parameters. It is also to be noted at this point that second spring component 232 could additionally also be provided with ventilation openings 25 or exclusively the edge area of diaphragm element 21 or exclusively first spring component 231. In each case, ventilation openings 25 increase the bendability of the affected structure areas in comparison to the closed middle area of diaphragm element 21 and thus promote the deformation thereof. This finally has a positive effect on the signal detection, which is also preferably carried out here with the aid of piezosensitive circuit elements in the area of spring structure 23 and/or in the adjoining edge area of diaphragm element 21.

Figure 3:
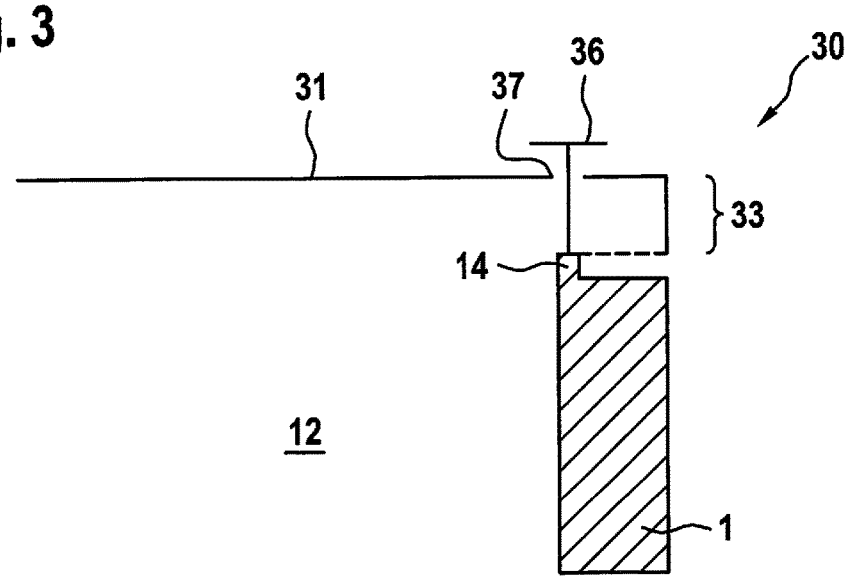

Specific embodiment 30 of a MEMS component according to the present invention, which is shown in FIG. 3, includes an overload protector for diaphragm element 31. This overload protector is implemented in the form of a structure element 36, which is T-shaped in section, and which originates from rigid base 14 at the upper edge of rear opening 12 and protrudes through a guide opening 37 in the edge area of diaphragm element 31 so that the T-bar of structure element 36, which is oriented in parallel to diaphragm element 31, is located above diaphragm element 31. Since guide opening 37 is smaller than this T-bar, the T-bar forms an upper stop for diaphragm element 31. The deflection of diaphragm element 31 downward is delimited by the substrate surface at the chip edge, which forms a stop for spring structure 33.

The mechanical properties of the spring structure of a MEMS component according to the present invention may be intentionally influenced by the layout of the spring structure. Three different measures for this purpose are illustrated by FIGS. 4 through 6.

Specific embodiment 40 of a MEMS component according to the present invention, which is shown in FIG. 4, essentially corresponds to the variant shown in FIG. 1a, insofar as both diaphragm element 41 and spring structure 43 are completely closed and spring structure 43 includes a first spring component 431, which is oriented in parallel to diaphragm element 41 and a second spring component 432, which is oriented essentially perpendicularly thereto. However, rear opening 42 of MEMS component 40 is designed in the form of a channel having two different opening radii. The rear opening cross section is larger than the diaphragm-side opening cross section, which is implemented by a step in the lateral opening wall. First spring component 431 extends—as in the case of MEMS component 10—from circumferential rigid base 14 at the upper edge of rear opening 12 up to the outer edge of MEMS chip 40. First spring component 431 of MEMS component 40 is accordingly larger than first spring component 131 of MEMS element 10, so that differences in the spring behavior are to be expected at identical structure thickness.

FIG. 5 shows a MEMS component 50 according to the present invention, spring structure 53 of which is double folded, so that it includes two spring components 531 and 533, which are oriented in parallel to diaphragm element 51 and two spring components 532 and 534, which are oriented essentially perpendicularly thereto. The measurement range and/or the sensitivity of the sensor structure may be increased by the double folding of spring structure 53, since the pressure related deformations are distributed onto four spring components here. As a result of the folding, this enlargement of the spring structure is not at the cost of the diaphragm or chip area.

Figure 6:
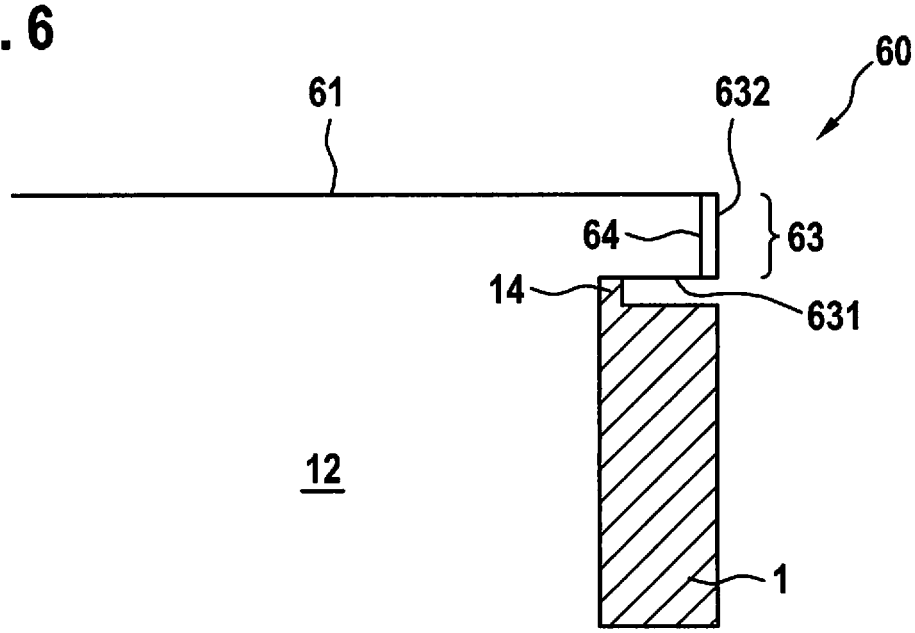

In embodiment 60, which is shown in FIG. 6, of a MEMS component according to the present invention, second spring component 632 of spring structure 63 was stiffened by an additional stiffening element 64, so that only first spring component 631, which is oriented in parallel to diaphragm element 61, of spring structure 63 is deformable. This exemplary embodiment illustrates that the spring properties and/or the stiffness of the spring structure of a MEMS component according to the present invention may also be intentionally influenced with the aid of stiffening elements.

What is claimed is:

1. A MEMS component, comprising:
   a layer structure;
   at least one diaphragm element formed in the layer structure, the diaphragm element spans an opening in the layer structure and is attached via a spring structure to the layer structure;
   wherein the spring structure includes at least one first spring component which is oriented essentially in parallel to the diaphragm element and is formed in a layer plane below the diaphragm element, the spring structure includes at least one second spring component, which is oriented essentially perpendicularly to the diaphragm element, and the spring structure is designed in such a way that the area of the diaphragm element is greater than the area of the opening which the diaphragm element spans; and
   wherein the first spring component is in the form of a circular ring.

2. The MEMS component as recited in claim 1, wherein the diaphragm element is essentially closed.

3. The MEMS component as recited in claim 1, wherein the first spring component is essentially closed.

4. The MEMS component as recited in claim 1, wherein openings, which enable a slow pressure equalization between two sides of the diaphragm element, are formed at least one of: i) in the spring structure, and ii) in an adjoining edge area of the diaphragm element.

5. The MEMS component as recited in claim 1, wherein a thickness of the diaphragm element and a thickness of the first spring component are selected independently of one another and differently.

6. The MEMS component as recited in claim 1, wherein the second spring component is stiffened in relation to the first spring component.

7. The MEMS component as recited in claim 1, wherein an overload protector for the diaphragm element is formed in the area of the spring structure.

8. The MEMS component as recited in claim 1, wherein connection areas between the diaphragm element and the spring structure, between the individual components of the spring structure, and between the spring structure and the layer structure are rounded, so that the component structure does not include any angled structures.

9. A MEMS microphone component having at least one sound-pressure-sensitive diaphragm element, comprising:
   a layer structure;
   at least one diaphragm element formed in the layer structure, the diaphragm element spans an opening in the layer structure and is attached via a spring structure to the layer structure;
   wherein the spring structure includes at least one first spring component which is oriented essentially in parallel to the diaphragm element and is formed in a layer plane below the diaphragm element, the spring structure includes at least one second spring component, which is oriented essentially perpendicularly to the diaphragm element, and the spring structure is designed in such a way that the area of the diaphragm element is greater than the area of the opening which the diaphragm element spans,
   wherein at least one piezosensitive circuit element for detecting the diaphragm deflections is situated at least one of: i) in the area of the spring structure, and ii) in the adjoining edge area of the diaphragm element, and
   wherein the first spring component is in the form of a circular ring.

10. The MEMS component as recited in claim 1, wherein the first spring component is formed to have a central circular cavity, and the diaphragm element spans the central circular cavity.

11. The MEMS microphone component as recited in claim 9, wherein the first spring component is formed to have a central circular cavity in a center of the first spring component, and the diaphragm element spans the central circular cavity.

12. The MEMS component as recited in claim 10, wherein the second spring component extends from an outer edge of the first spring component to an outer edge of the diaphragm element.

13. The MEMS microphone component as recited in claim 11, wherein the second spring component extends from an outer edge of the first spring component to an outer edge of the diaphragm element.

14. The MEMS component as recited in claim 12, wherein the diaphragm element is circular.

15. The MEMS microphone component as recited in claim 13, wherein the diaphragm element is circular.

* * * * *